(12) United States Patent
Kim et al.

(10) Patent No.: US 7,691,915 B2
(45) Date of Patent: Apr. 6, 2010

(54) PHOTOSENSITIVE RESIN COMPOSITION FOR FORMING ORGANIC INSULATING FILM AND DEVICE USING THE SAME

(75) Inventors: Min Sung Kim, Gunpo-si (KR); Sang Won Cho, Seoul (KR); Dong Ju Shin, Suwon-si (KR); Kil Sung Lee, Gwacheon-si (KR)

(73) Assignee: Cheil Industries Inc., Gumi-si (KR)

( * ) Notice: Subject to any disclaimer, the term of this patent is extended or adjusted under 35 U.S.C. 154(b) by 138 days.

(21) Appl. No.: 11/924,753

(22) Filed: Oct. 26, 2007

(65) Prior Publication Data

US 2008/0145786 A1 Jun. 19, 2008

(30) Foreign Application Priority Data

Dec. 13, 2006 (KR) ...................... 10-2006-0127180

(51) Int. Cl.
*G03F 7/004* (2006.01)
*G03F 7/028* (2006.01)

(52) U.S. Cl. .............................. 522/28; 522/32; 522/35; 522/79; 522/80; 522/126; 522/129; 522/130; 522/120; 528/424

(58) Field of Classification Search .................. 430/141, 430/188, 191, 192, 193, 270.1, 287.1, 165, 430/280.1, 281.1; 522/6, 33, 34, 39, 167, 522/173, 47, 48, 28, 35, 79, 80, 120, 126, 522/129, 130; 528/424
See application file for complete search history.

(56) References Cited

U.S. PATENT DOCUMENTS

| | | | | |
|---|---|---|---|---|
| 4,656,217 | A * | 4/1987 | Sugiura et al. | 524/430 |
| 4,916,045 | A * | 4/1990 | Koch et al. | 430/270.1 |
| 6,399,267 | B1 * | 6/2002 | Nishimura et al. | 430/192 |
| 6,448,301 | B1 * | 9/2002 | Gaddam et al. | 522/6 |
| 2006/0270776 | A1 * | 11/2006 | Durrant | 524/492 |
| 2006/0275700 | A1 * | 12/2006 | Lee et al. | 430/270.1 |
| 2009/0029129 | A1 * | 1/2009 | Pellerite et al. | 428/212 |
| 2009/0042035 | A1 * | 2/2009 | Kawata et al. | 428/413 |

FOREIGN PATENT DOCUMENTS

| | | |
|---|---|---|
| JP | 6-067421 A | 3/1994 |
| JP | 11-204399 A | 7/1999 |
| JP | 2002-226587 A | 8/2002 |
| JP | 2005-010763 A | 1/2005 |
| KR | 10-2006-127180 | * 12/2006 |
| KR | 10-0867948 | * 12/2006 |

OTHER PUBLICATIONS

English Translation of Abstract for Japanese Application No. 6-067421 (Foreign Cite No. 1).
English Translation of Abstract for Japanese Application No. 11-204399 (Foreign Cite No. 2).
English Translation of Abstract for Japanese Application No. 2002-226587 (Foreign Cite No. 3).
English Translation of Abstract for Japanese Application No. 2005-010763 (Foreign Cite No. 4).

* cited by examiner

*Primary Examiner*—Susan W Berman
(74) *Attorney, Agent, or Firm*—Summa, Additon & Ashe, P.A.

(57) ABSTRACT

Disclosed is a photosensitive resin composition. The composition comprises [A] an alkali-soluble resin, [B] a photoactive compound and [C] a solvent. The alkali-soluble resin is a copolymer including at least one structural unit with an aziridine group. The composition exhibits good storage stability, high sensitivity, high UV transmittance, high residual film ratio, improved coating uniformity and excellent pattern-forming properties. Further disclosed is an organic insulating film formed using the composition. The organic insulating film has excellent resistance to solvents and chemicals.

15 Claims, No Drawings

PHOTOSENSITIVE RESIN COMPOSITION FOR FORMING ORGANIC INSULATING FILM AND DEVICE USING THE SAME

CROSS-REFERENCE TO RELATED APPLICATION

This non-provisional application claims priority under 35 USC Section 119 from Korean Patent Application No. 10-2006-0127180, filed Dec. 13, 2006, which is hereby incorporated by reference in its entirety.

FIELD OF THE INVENTION

The present invention relates to a photosensitive resin composition useful for forming an organic insulating film in a liquid crystal display (LCD).

BACKGROUND OF THE INVENTION

Interlayer insulating films are used to insulate between layers in TFT-LCDs (thin film transistor-liquid crystal displays) and integrated circuit devices. Such interlayer insulating films are formed using particular types of photosensitive materials. There is a continuing need for materials which simplify processes and have high transmittance.

A typical interlayer insulating film is composed of a binder, a photoactive compound (PAC), an additive, a solvent and the like. Conventional epoxy acrylates have been used as curable monomers for binders for forming organic insulating films. Conventional epoxy acrylates, however, can have poor storage stability, low UV transmittance and inferior developability of the binders, which can lead to the occurrence of a number of defects during a LCD fabrication process. Thus, there is a need to develop binders having high UV transmittance, superior developability and good storage stability for fabricating LCDs, as well as being easily synthesized and readily available.

SUMMARY OF THE INVENTION

The present invention is directed to a photosensitive resin composition which can solve the problems associated with prior photosensitive resin compositions used in the production of interlayer insulating films. The photosensitive resin composition of the invention can exhibit superior performance characteristics in terms of chemical resistance, insulating properties, and sensitivity, among others. The photosensitive resin composition of the present invention can also exhibit markedly improved physical properties (e.g., high residual film ratio, high UV transmittance, excellent developability and good storage stability). The photosensitive resin composition of the present invention accordingly can be suitable for the formation of an interlayer insulating film in a LCD fabrication process.

The photosensitive resin composition of the present invention comprises an acrylic copolymer and can achieve superior performance characteristics in terms of transmittance, insulating properties, storage stability, developability, heat resistance, and the like. Accordingly, the photosensitive resin composition of the invention can be suitable for use in the formation of an interlayer insulating film during a LCD fabrication process.

In accordance with one aspect of the present invention, there is provided a photosensitive resin composition comprising [A] an alkali-soluble resin, [B] a photoactive compound and [C] a solvent, wherein the alkali-soluble resin [A] is a copolymer including at least one structural unit with an aziridine group.

In accordance with another aspect of the present invention, there is provided an organic insulating film which is formed with the present photosensitive resin composition.

In accordance with yet another aspect of the present invention, there is provided a display device including the present organic insulating film.

DETAILED DESCRIPTION OF THE INVENTION

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

[A] Alkali-Soluble Resin

The alkali-soluble resin allows a particular pattern to be easily formed without leaving any scum after developing. The alkali-soluble resin can be a copolymer of (a) at least one unsaturated compound containing an aziridine group, (b) an unsaturated carboxylic acid, an unsaturated carboxylic anhydride or a mixture thereof, and (c) an unsaturated olefinic compound. The copolymer may be in any form, such as a random, alternating, block or graft copolymer.

The aziridine group-containing unsaturated compound (a) functions to improve various characteristics (e.g., heat resistance, storage stability, UV transmittance and residual film ratio) of a pattern to be formed, and may be selected from compounds represented by Formulae 1 to 6:

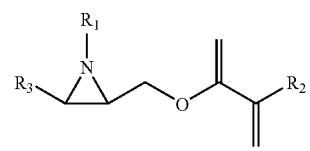

(1)

(wherein $R_1$, $R_2$ and $R_3$ are independently a hydrogen atom, a $C_1$-$C_{10}$ alkyl group, a $C_1$-$C_{10}$ alkoxy group, a phenyl group or a benzyl group);

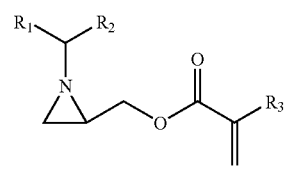

(2)

(wherein $R_1$, $R_2$ and $R_3$ are independently a hydrogen atom, a $C_1$-$C_{15}$ alkyl group, a $C_1$-$C_{15}$ alkoxy group, a phenyl group or a benzyl group);

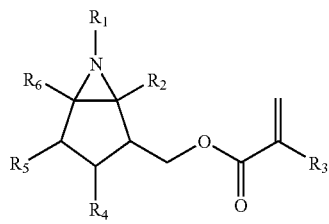

(3)

(wherein $R_1$, $R_2$, $R_3$, $R_4$, $R_5$ and $R_6$ are independently a hydrogen atom, a $C_1$-$C_{15}$ alkyl group, a $C_1$-$C_{15}$ alkoxy group, a phenyl group or a benzyl group);

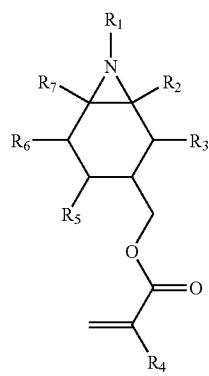

(4)

(wherein $R_1$, $R_2$, $R_3$, $R_4$, $R_5$, $R_6$ and $R_7$ are independently a hydrogen atom, a $C_1$-$C_{15}$ alkyl group, a $C_1$-$C_{15}$ alkoxy group, a phenyl group or a benzyl group);

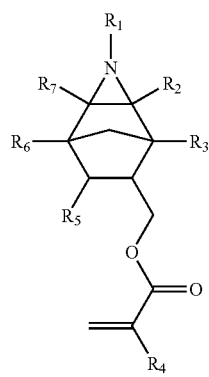

(5)

(wherein $R_1$, $R_2$, $R_3$, $R_4$, $R_5$, $R_6$ and $R_7$ are independently a hydrogen atom, a $C_1$-$C_{15}$ alkyl group, a $C_1$-$C_{15}$ alkoxy group, a phenyl group or a benzyl group); and

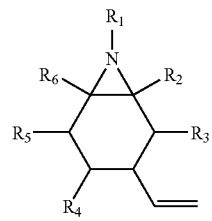

(6)

(wherein $R_1$, $R_2$, $R_3$, $R_4$, $R_5$ and $R_6$ are independently a hydrogen atom, a $C_1$-$C_{10}$ alkyl group, a $C_1$-$C_{10}$ alkoxy group, a phenyl group or a benzyl group).

These unsaturated compounds of Formulae 1 to 6 may be used alone or as a mixture thereof.

The copolymer can include a structural unit derived from the aziridine group-containing unsaturated compound (a) in an amount between about 5% and about 70% by weight, for example, between about 10% and about 50% by weight, based on the weight of the copolymer. When the structural unit derived from the aziridine group-containing unsaturated compound (a) is present in the copolymer in an amount of less than about 5% by weight, the composition may not form a pattern and the reliability of the composition may be impaired during subsequent processing. Meanwhile, when the structural unit derived from the aziridine group-containing unsaturated compound (a) is present in the copolymer in an amount greater than about 70% by weight, the storage stability of the copolymer may deteriorate.

Examples of suitable unsaturated carboxylic acids and unsaturated carboxylic anhydrides include without limitation: unsaturated monocarboxylic acids, such as acrylic acid and methacrylic acid; unsaturated dicarboxylic acids, such as maleic acid, furmaric acid, citraconic acid, mesaconic acid and itaconic acid; and anhydrides of the unsaturated dicarboxylic acids. These carboxylic acids may be used alone or as a mixture of two or more thereof Acrylic acid or methacrylic acid can provide advantageous copolymerization reactivity and solubility in an alkaline aqueous solution.

The copolymer can include a structural unit derived from the unsaturated carboxylic acid, the unsaturated carboxylic anhydride or a mixture thereof (b) in an amount between about 30% and about 80% by weight, for example, between about 45% and about 70% by weight, based on the weight of the copolymer. When the structural unit derived from the unsaturated carboxylic acid, the unsaturated carboxylic anhydride or a mixture thereof (b) is present in an amount of less than about 30% by weight, it can be difficult to dissolve the copolymer in an alkaline aqueous solution. Meanwhile, when the structural unit derived from the unsaturated carboxylic acid, the unsaturated carboxylic anhydride or a mixture thereof (b) is present in an amount greater than about 80% by weight, the copolymer can be excessively dissolved in an alkaline aqueous solution.

The olefinic compound (c) of the present invention can include compounds that are different from compounds (a) and (b). Exemplary olefinic compounds (c) can include acrylate or methacrylate compounds such as but not limited to compounds selected from the group consisting of methyl methacrylate, ethyl methacrylate, n-butyl methacrylate, sec-butyl methacrylate, tert-butyl methacrylate, methyl acrylate, isopropyl acrylate, cyclohexyl methacrylate, 2-methylcyclohexyl methacrylate, dicyclopentenyl acrylate, dicyclopentanyl acrylate, dicyclopentenyl methacrylate, dicyclopentanyl methacrylate, dicyclopentanyloxyethyl methacrylate, isobornyl methacrylate, phenyl methacrylate, phenyl acrylate, benzyl acrylate, 2-hydroxyethyl methacrylate, styrene, α-methyl styrene, m-methyl styrene, p-methyl styrene, vinyl toluene, p-methyl styrene, 1,3-butadiene, isoprene, 2,3-dimethyl-1,3-butadiene, and mixtures thereof.

The copolymer can include a structural unit derived from the olefinic compound (c) in an amount from about 10% to about 60% by weight, based on the weight of the copolymer. When the structural unit derived from the olefinic compound (c) is present in an amount of less than about 10% by weight, it can be difficult to form a pattern. Meanwhile, when the structural unit derived from the olefinic compound (c) is present in an amount greater than about 60% by weight, the copolymer can be highly soluble in an alkaline aqueous solution, which can make it difficult to form a pattern using the copolymer.

The alkali-soluble resin of the present invention can be prepared simply by copolymerization without an additional modification process. For example, the alkali-soluble resin may be prepared by radical polymerization of the compounds (a), (b) and (c) in a solvent in the presence of a polymerization initiator as a catalyst.

Examples of solvents useful in the present invention include without limitation: alcohols, such as methanol and ethanol; ethers, such as tetrahydrofuran; cellosolve esters, such as methyl cellosolve acetate; propylene glycol alkyl ether acetates, such as propylene glycol methyl ether acetate and propylene glycol propyl ether acetate; aromatic hydrocarbons; ketones; and esters; and the like, as well as combinations thereof The solvent may be the same as the solvent used in the composition of the present invention.

As the catalyst for the radical polymerization, any known radical polymerization initiator may be used. Examples of suitable radical polymerization catalysts useful in the present invention include without limitation: azo compounds, such as 2,2-azobisisobutyronitrile, 2,2-azobis-(2,4-dimethylvaleronitrile) and 2,2-azobis-(4-methoxy-2,4-dimethylvaleronitrile); organic peroxides, such as benzoyl peroxide, lauroyl peroxide, t-butyl peroxypivalate and 1,1'-bis-(t-butylperoxy)cyclohexane; and hydrogen peroxide; and the like, as well as combinations thereof Peroxide may be used as the radical polymerization initiator in a combination with a reducing agent, which makes a redox initiator.

The weight average molecular weight ($M_w$) of the alkali-soluble resin can range from about 3,000 to about 25,000, for example from about 5,000 to about 15,000, on a basis of polystyrene. When the alkali-soluble resin has a weight average molecular weight ($M_w$) of less than about 3,000, the final composition can exhibit deteriorated film developability, low residual film ratio, poor heat resistance and decreased adhesiveness, and can form a poorly shaped pattern. Meanwhile, when the alkali-soluble resin has a weight average molecular weight ($M_w$) higher than about 25,000, the final composition can exhibit low sensitivity and transmittance and a pattern of low quality.

Photoactive Compound [B]

Exemplary photoactive compounds [B] useful in the present invention can include without limitation a 1,2-quinonediazide compound, 1,2-quinonediazide-4-sulfonic acid ester, 1,2-quinonediazide-5-sulfonic acid ester or 1,2-quinonediazide-6-sulfonic acid ester, and the like, as well as mixtures thereof.

The 1,2-quinonediazide compound may be prepared by esterification of a naphthoquinonediazide sulfonic acid halide and a phenolic compound in the presence of a weak base.

Exemplary phenolic compounds useful in this embodiment of the invention can include without limitation 2,3,4-trihydroxybenzophenone, 2,4,6-trihydroxybenzophenone, 2,2',4,4'-tetrahydroxybenzophenone, 2,3,4,3'-tetrahydroxybenzophenone, 2,3,4,4'-tetrahydroxybenzophenone, 2,3,4,2'-tetrahydroxy-4'-methylbenzophenone, 2,3,4,4'-tetrahydroxy-3'-methoxybenzophenone, 2,2',3,4,6'-pentahydroxybenzophenone, 2,3,4,4',5,6-hexahydroxybenzophenone, 3,3',4,4',5,5'-hexahydroxybenzophenone, bis(2,4-dihydroxyphenyl)methane, bis(p-hydroxyphenyl)methane, tri(p-hydroxyphenyl)methane, 1,1,1-tri(p-hydroxyphenyl)ethane, bis(2,3,4-trihydroxyphenyl)methane, 2,2-bis(2,3,4-trihydroxyphenyl)propane, 1,1,3-tris(2,5-dimethyl-4-hydroxyphenyl)-3-phenylpropane, 4,4'-[1-[4-[1-[4-hydroxyphenyl]-1-methylethyl]phenyl]ethylidene]bisphenol, bis(2,5-dimethyl-4-hydroxyphenyl)-2-hydroxyphenylmethane, and the like. These phenolic compounds may be used alone or as a mixture of two or more thereof.

The 1,2-quinonediazide compound can have a degree of esterification of about 45 to about 85%. If the 1,2-quinonediazide compound has a degree of esterification lower than about 45%, the final composition can have considerably low residual film ratio and low sensitivity. Meanwhile, if the 1,2-quinonediazide compound has at a degree of esterification higher than about 85%, the final composition may tend to exhibit poor storage stability.

The photoactive compound [B] can be present in the copolymer in an amount of about 5 to about 80 parts by weight, for example, about 10 to about 35 parts by weight, based on 100 parts by weight of the alkali-soluble resin [A]. When the photoactive compound [B] is used in an amount of less than about 5 parts by weight, a difference in solubility between exposed and unexposed areas may not be enough to form a pattern. Meanwhile, when the photoactive compound [B] is used in an amount of more than about 80 parts by weight, a large amount of the photoactive compound can remain unreacted upon light irradiation for a short time, which can cause an excessive reduction in the solubility of the photoactive compound in an alkaline aqueous solution. As a result, it can be difficult to develop the composition.

Solvent [C]

Examples of the solvent useful in the present invention include without limitation methanol, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, ethylene glycol dimethyl ether, ethylene glycol diethyl ether, ethylene glycol methyl ethyl ether, propylene glycol monoethyl ether, propylene glycol propyl ether, propylene glycol butyl ether, propylene glycol methyl ethyl acetate, propylene glycol ethyl ether acetate, propylene glycol propyl ether acetate, propylene glycol butyl ether acetate, propylene glycol methyl ethyl propionate, propylene glycol ethyl ether propionate, propylene glycol propyl ether propionate, propylene glycol butyl ether propionate, toluene, xylene, methyl ethyl ketone, cyclohexanone, 4-hydroxy-4-methyl-2-pentanone, methyl acetate, ethyl acetate, propyl acetate, butyl acetate, ethyl 2-hydroxypropionate, methyl 2-hydroxy-2-methyl propionate, ethyl 2-hydroxy-2-methyl propionate, methyl hydroxyacetate, ethyl hydroxyacetate, butyl hydroxyacetate, methyl lactate, ethyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methyl butyrate, methyl methoxyacetate, ethyl methoxyacetate, propyl methoxyacetate, butyl methoxyacetate, methyl ethoxyacetate, ethyl methoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, butyl 3-butoxypropionate, and the like. These solvents may be used alone or as a mixture of two or more thereof.

The solvent can be present in such an amount that the solids content of the photosensitive resin composition according to the present invention is between about 15% and about 60% by weight, for example between about 20% and about 45% by weight. When the solids content of the composition is lower than about 15% by weight, the composition can exhibit reduced coating uniformity and coating thickness. Meanwhile, when the solids content of the composition is higher than about 60% by weight, there is a likelihood of damage to a coater.

If necessary, the photosensitive resin composition of the present invention may further comprise at least one additive selected from an adhesive, an acrylic compound, a surfactant, and other additives, as well as mixtures thereof.

The adhesive can be used to improve the adhesion between a substrate and a pattern in an organic insulating film to be formed using the composition of the present invention and may be used in an amount of about 0.1 to about 30 parts by weight, based on 100 parts by weight of the alkali-soluble resin. An exemplary adhesive useful in the present invention include without limitation a silane compound substituted with at least one reactive group selected from carboxyl, methacryl, isocyanate, epoxy groups, and the like. Specific examples of the adhesive include γ-methacryloxypropyltrimethoxysilane, vinyltriacetoxysilane, vinyltrimethoxysilane, γ-isocyanatopropyltriethoxysilane, γ-glycidoxypropyltrimethoxysilane, and β-3,4-epoxycyclohexylethyltrimethoxysilane. Such silane compounds may be used alone or as a mixture of two or more thereof.

The surfactant can be added to effectively improve the coatability of the photosensitive resin composition and prevent the occurrence of defects.

Hereinafter, the present invention will be explained in more detail with reference to the following examples and comparative examples. However, these examples are given for the purpose of illustration and are not intended to limit the scope of the invention.

EXAMPLES

Synthetic Examples 1 to 7

Preparation of Alkali-soluble Resins

Synthetic Example 1

10 parts by weight of 2,2'-azobis(2,4-dimethylvaleronitril), 200 parts by weight of propylene glycol monomethyl ether acetate, 25 parts by weight of methacrylic acid, 25 parts by weight of the aziridinyl methacrylate of Formula 7, 15 parts by weight of styrene and 35 parts by weight of dicyclopentenyl methacrylate are put in a flask equipped with a condenser and a stirrer, followed by flushing with nitrogen.

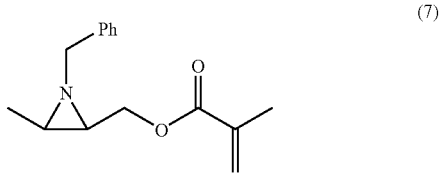

(7)

The solution is warmed to 55° C. with slow stirring and maintained at the same temperature for 4 hours to give a polymer including a copolymer. The solids content of the polymer mixture is measured to be 33 wt %. 100 parts by weight of the polymer mixture is precipitated in 1,000 parts by weight of ether, filtered, dried under vacuum at a temperature not higher than 30° C. to completely remove the solvent and the unreacted monomers contained in the solvent, affording an acrylic copolymer having a weight average molecular weight of 13,500.

Synthetic Example 2

The procedure of Synthetic Example 1 is repeated except that the aziridyl methacrylate of Formula 8 is used instead of the aziridinyl methacrylate of Formula 7 to afford an acrylic copolymer having a weight average molecular weight of 15,500.

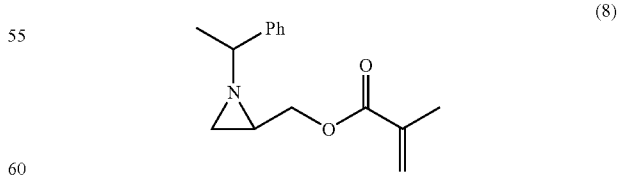

(8)

Synthetic Example 3

The procedure of Synthetic Example 1 is repeated except that the aziridyl methacrylate of Formula 9 is used instead of the aziridinyl methacrylate of Formula 7 to afford an acrylic copolymer having a weight average molecular weight of 12,000.

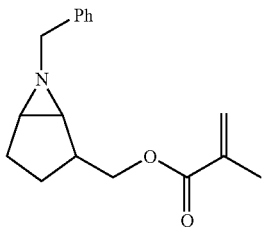

(9)

Synthetic Example 4

The procedure of Synthetic Example 1 is repeated except that the aziridyl methacrylate of Formula 10 is used instead of the aziridinyl methacrylate of Formula 7 to afford an acrylic copolymer having a weight average molecular weight of 12,800.

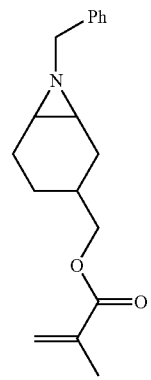

(10)

Synthetic Example 5

The procedure of Synthetic Example 1 is repeated except that the aziridyl methacrylate of Formula 11 is used instead of the aziridinyl methacrylate of Formula 7 to afford an acrylic copolymer having a weight average molecular weight of 13,000.

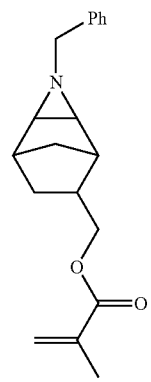

(11)

Synthetic Example 6

The procedure of Synthetic Example 1 is repeated except that the aziridyl vinyl compound of Formula 12 is used instead of the aziridinyl methacrylate of Formula 7 to afford an acrylic copolymer having a weight average molecular weight of 11,000.

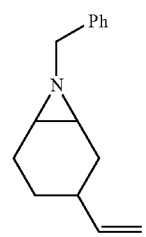

(12)

Synthetic Example 7

The procedure of Synthetic Example 1 is repeated except that the methylglycidyl methacrylate of Formula 13 is used instead of the aziridinyl methacrylate of Formula 7 to afford an acrylic copolymer having a weight average molecular weight of 10,800.

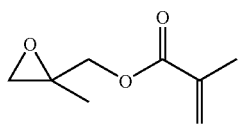

(13)

Synthetic Example 8

The procedure of Synthetic Example 1 is repeated except that the epoxy methacrylate of Formula 14 is used as a monomer instead of the aziridinyl methacrylate of Formula 7 to afford an acrylic copolymer having a weight average molecular weight of 12,300.

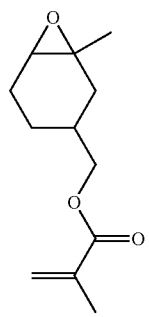

(14)

Synthetic Example 9

Preparation of 1,2-Quinonediazide Compound

One mole of 4,4'-[1-[4-[1-[4-hydroxyphenyl]-1-methyl-ethyl]phenyl]ethylidene]bisphenol and two moles of 1,2- naphthoquinonediazide-5-sulfonic acid chloride are subjected to condensation reaction to give 4,4'-[1-[4-[1-[4-hydroxyphenyl]-1-methylethyl]phenyl]ethylidene]bisphenol 1,2-naphthoquinonediazide-5-sulfonic acid ester.

Examples 1 to 6

20 parts by weight of 4,4'-[1-[4-[1-[4-hydroxyphenyl]-1-methylethyl]phenyl]ethylidene]bisphenol 1,2-naphthoquinonediazide-5-sulfonic acid ester prepared in Synthetic Example 9 are mixed with 100 parts by weight of each of the copolymers prepared in Synthetic Examples 1 to 6, dissolved in diethylene glycol dimethyl ether until the solids content reached 30% by weight, and passed through a 0.2 μm millipore filter to prepare a photosensitive resin composition in the form of a solution.

Example 7

A photosensitive resin composition in the form of a solution is prepared in the same manner as in Example 1, except that y-glycidoxypropyltrimethoxysilane (S-510, Chisso) is further mixed in an amount of 5 parts by weight, based on 100 parts by weight of the copolymer prepared in Synthetic Example 1.

Comparative Examples 1 and 2

Photosensitive resin compositions in the form of a solution are prepared in the same manner as in Examples 1 to 6, except that each of the copolymers prepared in Synthetic Examples 7 and 8 is used.

The physical properties of the photosensitive resin compositions prepared in Examples 1 to 7 and Comparative Examples 1 and 2 are evaluated in accordance with the following respective procedures. The results are shown in Table 1.

1) Sensitivity

Each of the compositions is applied to a glass substrate using a spin coater and pre-baked on a hot plate at 100° C. for 3 minutes to form a film. The film is irradiated with light at an intensity of 20.0 mW/cm$^3$ for 15 seconds through a patterned mask. Thereafter, the resulting film is developed with an aqueous solution of tetramethylammonium hydroxide (0.4 wt %) at 25° C. for 130 seconds, cleaned with ultrapure water for 90 seconds, and blown with compressed air until dry to form a pattern.

The pattern is irradiated with UV at an intensity of 25.0 mW/cm$^3$ for 32 seconds and cured in an oven at 220° C. for 60 minutes to form a patterned film.

2) Residual Film Ratio

Each of the photoresist compositions is applied to a glass substrate using a spin coater and pre-baked to form a film. The thickness of the film is measured. Thereafter, the film is subjected to post baking to remove the solvent and measured for thickness. The ratio of the thickness measured after pre-baking to the thickness measured after post-baking is calculated as the residual film ratio.

3) UV Transmittance

The light transmittance of the patterned film at 400 nm is measured using a spectrophotometer for transparency evaluation.

4) Storage Stability

The patterned film is allowed to stand in a clean room for three weeks while maintaining a temperature of 23° C. and a humidity of 40%. A variation in the sensitivity (mJ/sqcm) of the film is checked daily. When the sensitivity variation is below 10%, the storage stability is judged to be good ("O"). When the sensitivity variation is between 10% and 20%, the storage stability is judged to be fair ("□"). When the sensitivity variation was above 20%, the storage stability is judged to be poor ("x").

TABLE 1

| Physical properties | Sensitivity | Residual film ratio (%) | UV transmittance (400 nm) | Storage stability |
|---|---|---|---|---|
| Example 1 | 100 | 94 | 94.1 | O |
| Example 2 | 120 | 93 | 92.3 | O |
| Example 3 | 135 | 92 | 92.2 | O |
| Example 4 | 130 | 91 | 92.8 | O |
| Example 5 | 150 | 90 | 93.2 | O |
| Example 6 | 150 | 91 | 92.6 | O |
| Example 7 | 145 | 93 | 92.1 | O |
| Comparative Example 1 | 210 | 90 | 91.2 | □ |
| Comparative Example 2 | 215 | 89 | 92.3 | X |

As can be seen from the results of Table 1, the photosensitive resin compositions prepared in Examples 1 to 7 show better results in terms of transmittance, storage stability and sensitivity than the compositions prepared in Comparative Examples 1 and 2.

As apparent from the above description, the photosensitive resin composition of the present invention can exhibit superior performance characteristics in terms of insulating properties and sensitivity, and the like. Particularly, the photosensitive resin composition of the present invention can exhibit markedly improved physical properties (e.g., high residual film ratio, high UV transmittance, excellent developability and good storage stability). Therefore, the photosensitive resin composition of the present invention is suitable for the formation of an interlayer insulating film in a liquid crystal display (LCD) fabrication process.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A photosensitive resin composition comprising:
   [A] an alkali-soluble resin,
   [B] a photoactive compound, and
   [C] a solvent,
   wherein the alkali-soluble resin [A] is a copolymer comprising at least one structural unit derived from at least one compound selected from aziridine group-containing unsaturated compounds represented by Formulae 1 to 6:

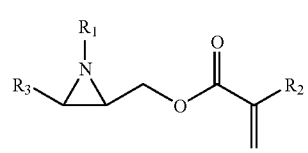

(1)

wherein $R_1$, $R_2$ and $R_3$ are independently a hydrogen atom, a $C_1$-$C_{10}$ alkyl group, a $C_1$-$C_{10}$ alkoxy group, a phenyl group or a benzyl group;

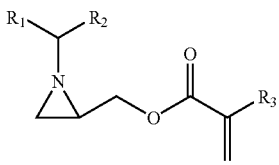
(2)

wherein $R_1$, $R_2$ and $R_3$ are independently a hydrogen atom, a $C_1$-$C_{15}$ alkyl group, a $C_1$-$C_{15}$ alkoxy group, a phenyl group or a benzyl group;

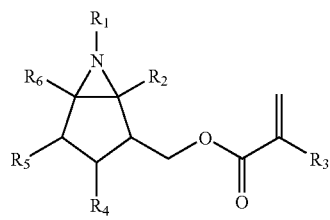
(3)

wherein $R_1$, $R_2$, $R_3$, $R_4$, $R_5$ and $R_6$ are independently a hydrogen atom, a $C_1$-$C_{15}$ alkyl group, a $C_1$-$C_{15}$ alkoxy group, a phenyl group or a benzyl group;

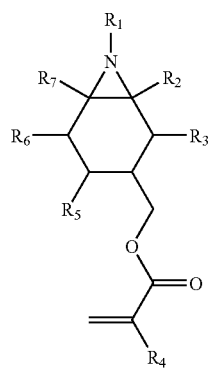
(4)

wherein $R_1$, $R_2$, $R_3$, $R_4$, $R_5$ $R_6$ and $R_7$ are independently a hydrogen atom, a $C_1$-$C_{15}$ alkyl group, a $C_1$-$C_{15}$ alkoxy group, a phenyl group or a benzyl group;

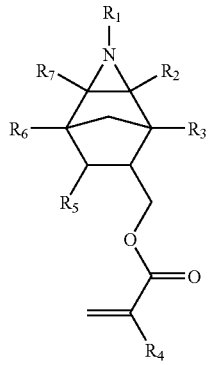
(5)

wherein $R_1$, $R_2$, $R_3$, $R_4$, $R_5$ $R_6$ and $R_7$ are independently a hydrogen atom, a $C_1$-$C_{15}$ alkyl group, a $C_1$-$C_{15}$ alkoxy group, a phenyl group or a benzyl group; and

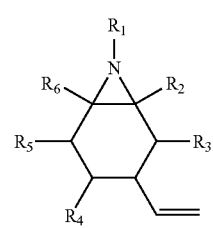
(6)

wherein $R_1$, $R_2$, $R_3$, $R_4$, $R_5$ and $R_6$ are independently a hydrogen atom, a $C_1$-$C_{10}$ alkyl group, a $C_1$-$C_{10}$ alkoxy group, a phenyl group or a benzyl group.

2. The photosensitive resin composition according to claim 1, wherein the alkali-soluble resin is a copolymer comprising a structural unit derived from at least one compound selected from aziridine group-containing unsaturated compounds represented by Formulae 7 to 12:

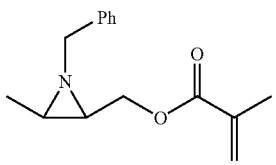
(7)

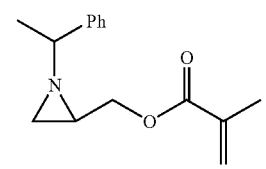
(8)

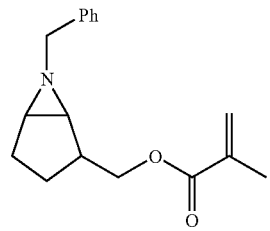
(9)

-continued

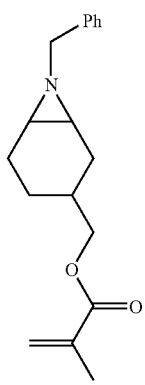
(10)

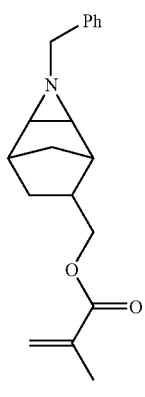
(11)

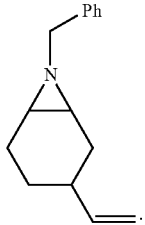
(12)

3. The photosensitive resin composition according to claim 1, wherein the alkali-soluble resin is a copolymer of (a) at least one unsaturated compound comprising an aziridine group, (b) an unsaturated carboxylic acid, an unsaturated carboxylic anhydride or a mixture thereof, and (c) an unsaturated olefinic compound.

4. The photosensitive resin composition according to claim 3, wherein (b) an unsaturated carboxylic acid, an unsaturated carboxylic anhydride or a mixture thereof comprises acrylic acid, methacrylic acid, or a mixture thereof.

5. The photosensitive resin composition according to claim 1, wherein the alkali-soluble resin has a weight average molecular weight ($M_w$) of about 3,000 to about 25,000.

6. The photosensitive resin composition according to claim 1, wherein the alkali-soluble resin comprises about 5% to about 70% by weight of a structural unit derived from (a) an aziridine group-containing unsaturated compound, about 30% to about 80% by weight of a structural unit derived from (b) an unsaturated carboxylic acid, an unsaturated carboxylic anhydride or a mixture thereof, and about 10% to about 60% by weight of a structural unit derived from (c) an unsaturated olefinic compound.

7. The photosensitive resin composition according to claim 1, comprising the photoactive compound [B] in an amount of about 5 to about 80 parts by weight, based on 100 parts by weight of the alkali-soluble resin [A].

8. The photosensitive resin composition according to claim 1, comprising a solids content of between about 15% and about 60% by weight.

9. The photosensitive resin composition according to claim 1, wherein the photoactive compound [B] is a 1,2-quinonediazide compound.

10. The photosensitive resin composition according to claim 9, wherein said 1,2-quinonediazinde compound is selected from the group consisting of 1,2-quinonediazide compounds, 1,2-quinonediazide-4-sulfonic acid esters, 1,2-quinonediazide-5-sulfonic acid esters, 1,2-quinonediazide-6-sulfonic acid esters, and mixtures thereof.

11. The photosensitive resin composition according to claim 9, wherein the 1,2-quinonediazide compound is prepared by esterification of a naphthoquinonediazide sulfonic acid halide and a phenolic compound and has a degree of esterification of about 45 to about 85%.

12. The photosensitive resin composition according to claim 1, further comprising at least one silane compound substituted with a carboxyl, methacryl, isocyanate or epoxy group as a reactive group.

13. The photosensitive resin composition according to claim 12, comprising the silane compound in an amount of about 0.1 to about 30 parts by weight, based on 100 parts by weight of the alkali-soluble resin.

14. An organic insulating film formed using a photosensitive resin composition comprising:

[A] an alkali-soluble resin,
[B] a photoactive compound, and
[C] a solvent, wherein the alkali-soluble resin [A] is a copolymer comprising at least one structural unit derived from at least one compound selected from aziridine group-containing unsaturated compounds represented by Formulae 1 to 6:

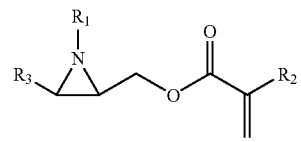
(1)

wherein $R_1$, $R_2$ and $R_3$ are independently a hydrogen atom, a $C_1$-$C_{10}$ alkyl group, a $C_1$-$C_{10}$ alkoxy group, a phenyl group or a benzyl group;

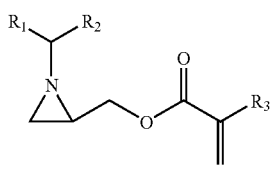
(2)

wherein $R_1$, $R_2$ and $R_3$ are independently a hydrogen atom, a $C_1$-$C_{15}$ alkyl group, a $C_1$-$C_{15}$ alkoxy group, a phenyl group or a benzyl group;

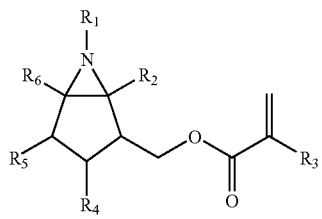

(3)

wherein $R_1$, $R_2$, $R_3$, $R_4$, $R_5$ and $R_6$ are independently a hydrogen atom, a $C_1$-$C_{15}$ alkyl group, a $C_1$-$C_{15}$ alkoxy group, a phenyl group or a benzyl group;

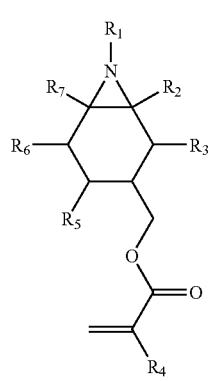

(4)

wherein $R_1$, $R_2$, $R_3$, $R_4$, $R_5$ $R_6$ and $R_7$ are independently a hydrogen atom, a $C_1$-$C_{15}$ alkyl group, a $C_1$-$C_{15}$ alkoxy group, a phenyl group or a benzyl group;

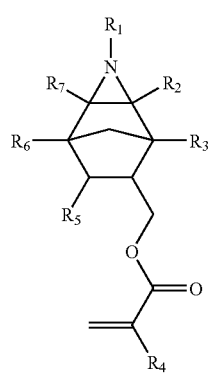

(5)

wherein $R_1$, $R_2$, $R_3$, $R_4$, $R_5$ $R_6$ and $R_7$ are independently a hydrogen atom, a $C_1$-$C_{15}$ alkyl group, a $C_1$-$C_{15}$ alkoxy group, a phenyl group or a benzyl group; and

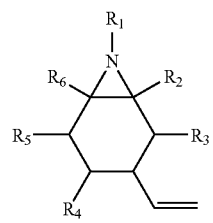

(6)

wherein $R_1$, $R_2$, $R_3$, $R_4$, $R_5$ and $R_6$ are independently a hydrogen atom, a $C_1$-$C_{10}$ alkyl group, a $C_1$-$C_{10}$ alkoxy group, a phenyl group or a benzyl group.

15. A display device comprising an organic insulating film formed using a photosensitive resin composition comprising:

[A] an alkali-soluble resin,

[B] a photoactive compound, and

[C] a solvent, wherein the alkali-soluble resin [A] is a copolymer comprising at least one structural unit derived from at least one compound selected from aziridine group-containing unsaturated compounds represented by Formulae 1 to 6:

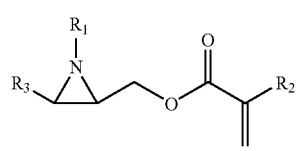

(1)

wherein $R_1$, $R_2$ and $R_3$ are independently a hydrogen atom, a $C_1$-$C_{10}$ alkyl group, a $C_1$-$C_{10}$ alkoxy group, a phenyl group or a benzyl group;

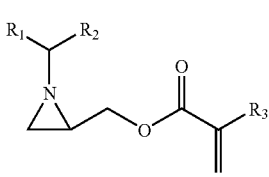

(2)

wherein $R_1$, $R_2$ and $R_3$ are independently a hydrogen atom, a $C_1$-$C_{15}$ alkyl group, a $C_1$-$C_{15}$ alkoxy group, a phenyl group or a benzyl group;

(3)

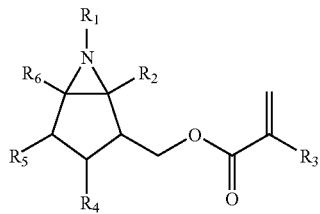

wherein $R_1$, $R_2$, $R_3$, $R_4$, $R_5$ and $R_6$ are independently a hydrogen atom, a $C_1$-$C_{15}$ alkyl group, a $C_1$-$C_{15}$ alkoxy group, a phenyl group or a benzyl group;

(4)

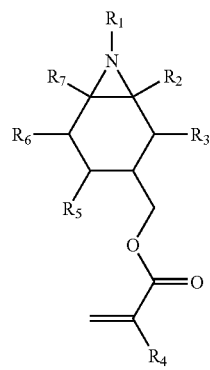

wherein $R_1$, $R_2$, $R_3$, $R_4$, $R_5$ $R_6$ and $R_7$ are independently a hydrogen atom, a $C_1$-$C_{15}$ alkyl group, a $C_1$-$C_{15}$ alkoxy group, a phenyl group or a benzyl group;

(5)

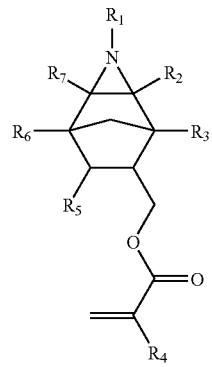

wherein $R_1$, $R_2$, $R_3$, $R_4$, $R_5$ $R_6$ and $R_7$ are independently a hydrogen atom, a $C_1$-$C_{15}$ alkyl group, a $C_1$-$C_{15}$ alkoxy group, a phenyl group or a benzyl group; and (6)

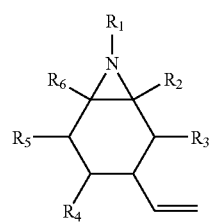

wherein $R_1$, $R_2$, $R_3$, $R_4$, $R_5$ and $R_6$ are independently a hydrogen atom, a $C_1$-$C_{10}$ alkyl group, a $C_1$-$C_{10}$ alkoxy group, a phenyl group or a benzyl group.

* * * * *

UNITED STATES PATENT AND TRADEMARK OFFICE
CERTIFICATE OF CORRECTION

PATENT NO.        : 7,691,915 B2                                    Page 1 of 1
APPLICATION NO.   : 11/924753
DATED             : April 6, 2010
INVENTOR(S)       : Min Sung Kim et al.

It is certified that error appears in the above-identified patent and that said Letters Patent is hereby corrected as shown below:

In the Specification:

Column 2 Line 40 Formulae 1 is depicted as:

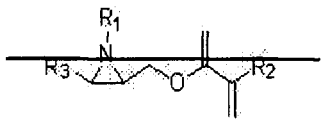

and should be depicted as:

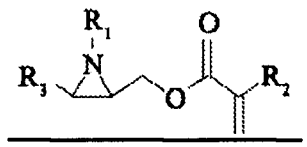

Signed and Sealed this

Twenty-second Day of June, 2010

David J. Kappos
*Director of the United States Patent and Trademark Office*